US005761051A

United States Patent [19]
Tran

[11] Patent Number: 5,761,051
[45] Date of Patent: *Jun. 2, 1998

[54] MULTI-LAYER CIRCUIT BOARD HAVING A SUPPLY BUS AND DISCRETE VOLTAGE SUPPLY PLANES

[75] Inventor: Thanh T. Tran, Tomball, Tex.

[73] Assignee: Compaq Computer Corporation, Houston, Tex.

[*] Notice: The term of this patent shall not extend beyond the expiration date of Pat. No. 5,764,491.

[21] Appl. No.: 625,932

[22] Filed: Apr. 1, 1996

Related U.S. Application Data

[63] Continuation of Ser. No. 365,914, Dec. 29, 1994, abandoned.

[51] Int. Cl.$^6$ .................... H05K 1/11; H05K 1/16; H05K 7/02
[52] U.S. Cl. .................... 361/794; 174/255; 174/260; 361/777; 361/780; 361/782; 361/783
[58] Field of Search .................... 174/253, 255, 174/260, 261, 35 R, 35 GC, 35 TS; 257/700, 723, 724, 725, 728, 659; 333/181, 182, 185, 246, 247; 361/777, 780, 782, 783, 792–795, 818; 439/68, 69, 108, 109, 92, 93, 607, 609

[56] References Cited

U.S. PATENT DOCUMENTS

| | | | |
|---|---|---|---|
| 4,984,132 | 1/1991 | Sakurai et al. | 361/794 |
| 5,023,753 | 6/1991 | Abe | 361/760 |
| 5,068,631 | 11/1991 | Vince | 174/255 |
| 5,131,140 | 7/1992 | Zimmer | 361/777 |
| 5,488,540 | 1/1996 | Hatta | 361/794 |

FOREIGN PATENT DOCUMENTS 3-106097  5/1991  Japan .................... 361/761

*Primary Examiner*—Donald Sparks
*Attorney, Agent, or Firm*—Fish & Richardson P.C.

[57] ABSTRACT

A power distribution system for a multi-layer circuit board includes a board having a component layer with signal runs formed thereon, a ground layer, an insulation layer, and a power supply system. The power supply system includes a supply bus, discrete voltage supply planes, and isolation devices mounted on the component layer, each connecting one of the discrete voltage supply planes to the supply bus. The component layer has a first area for components which perform a first function and a second area for components which perform a second function. The discrete voltage supply planes include a first supply plane corresponding to the first area and a second supply plane corresponding to the second area. The first supply plane is disposed directly beneath and is shaped substantially the same as the first area, and the second supply plane is disposed directly beneath and is shaped substantially the same as the second area. The first supply plane, the second supply plane, and the supply bus lie in a plane between the insulation layer and the component layer.

16 Claims, 3 Drawing Sheets

MULTI-LAYER CIRCUIT BOARD HAVING A SUPPLY BUS AND DISCRETE VOLTAGE SUPPLY PLANES

This application is a file wrapper continuation of U.S. application Ser. No. 08/365,914, filed Dec. 29, 1994, now abandoned.

FIELD OF THE INVENTION

The invention relates to power distribution on a multi-layer circuit board.

BACKGROUND OF THE INVENTION

Multi-layer circuit boards are in widespread use in today's personal computers. Multi-layer boards provide a number of advantages over single-layer boards, including most notably increased space utilization and a corresponding reduction in physical size.

A typical multi-layer board is illustrated in prior art FIG. 1. In this example, the board comprises, from top to bottom, a component layer 11 on which components are mounted and signal runs are formed (not shown), a $V_{DD}$ plane 13 of conductive material which is typically supplied with +5 volts, an insulating layer 15, and a ground plane 17 of conductive material. This multi-layer arrangement makes power and ground connections available at any location on the board simply by connecting through to the appropriate layer. Thus, space on the board which would otherwise be required for power and ground busses is now available for other uses.

Components mounted on component layer 11 are, in most instances, grouped together in functional units. The basic functional units of a typical personal computer are the CPU and related components, memory components, input/output components, audio components, modem components, and graphics components. As illustrated in FIG. 1, each of these functional units occupies a defined physical area on the board (memory area 21, CPU area 19, I/O area 23, audio area 25, modem area 27, and graphics subsystem area 29, respectively). While these areas are shown in FIG. 1 to be rectangular and equal in size, in actuality these areas will be irregularly shaped according to design considerations and certain areas may be significantly larger than others.

SUMMARY OF THE INVENTION

According to one embodiment, the invention relates to a multi-layer circuit board, comprising a component layer and a power supply system comprising a supply bus, discrete voltage supply planes, and isolation devices each connecting one of the discrete voltage supply planes to the supply bus.

In some aspects, the component layer has a first area for components which perform a first function and a second area for components which perform a second function, and the discrete voltage supply planes comprise a first supply plane corresponding to the first area and a second supply plane corresponding to the second area. In some aspects, the first supply plane is disposed directly beneath the first area, and the second supply plane is disposed directly beneath the second area. In some aspects, the first supply plane and the second supply plane are coplanar.

In some embodiments, the first supply plane and the first area are shaped substantially the same, and the second supply plane and the second area are shaped substantially the same.

In some embodiments, the first function comprises a high-frequency operation, and the isolation device corresponding to the first supply plane comprises a filter having a ferrite element. In other embodiments, the first function comprises a low-frequency operation, and the isolation device corresponding to the first supply plane comprises a filter having an inductor. In other embodiments, the first function comprises a mixed low and high-frequency operation, and the isolation device corresponding to the first supply plane comprises a filter having an inductor and a ferrite element.

In some embodiments, the first function is a central processing function. In some embodiments, the second function is an audio function. In other embodiments, the second function is an graphics function. In still other embodiments, the second function is a modem function.

In some embodiments, the isolation devices are mounted on the component layer. In some aspects, the supply bus and the discrete voltage supply planes are coplanar. In some aspects, the multi-layer board further comprises a ground plane. In some aspects, the supply bus and the discrete voltage supply planes are disposed between the ground plane and the component layer.

In some embodiments, the invention relates to a multi-layer circuit board, comprising a component layer, a ground layer, an insulation layer, and a power supply system comprising a supply bus, discrete voltage supply planes, and isolation devices mounted on the component layer each connecting one of the discrete voltage supply planes to the supply bus; wherein the component layer has a first area for components which perform a first function and a second area for components which perform a second function; wherein the discrete voltage supply planes comprise a first supply plane corresponding to the first area and a second supply plane corresponding to the second area; wherein the first supply plane is disposed directly beneath and is shaped substantially the same as the first area, and the second supply plane is disposed directly beneath and is shaped substantially the same as the second area; and wherein the first supply plane, the second supply plane, and the supply bus lie in a plane between the insulation layer and the component layer.

In some embodiments, the invention relates to a power distribution system for a multi-layer circuit board upon which components of a first functionality are mounted in a first area and components of a second functionality are mounted in a second area, comprising a first supply plane corresponding to the first area, a second supply plane corresponding to the second area, and isolation means for isolating the first supply plane from the second supply plane. In some aspects, the first supply plane and the second supply plane are coplanar. In some aspects, the isolation means comprises a supply bus, a first filter connecting the first supply plane to the supply bus, and a second filter connecting the second supply plane to the supply bus.

In some embodiments, the invention relates to a method of reducing noise coupling between a component mounted in one area of a multi-layer board and a component mounted in a second area of a multi-layer board, comprising the steps of providing a bus to supply voltage to the multi-layer board, passing an isolated version of the voltage to a discrete supply plane associated with the one area, and passing a separately isolated version of the voltage to a second discrete supply plane associated with the second area.

DESCRIPTION OF THE PREFERRED EMBODIMENTS

Preferred embodiments of the invention will now be described in detail with reference to the accompanying figures.

Figure 1:
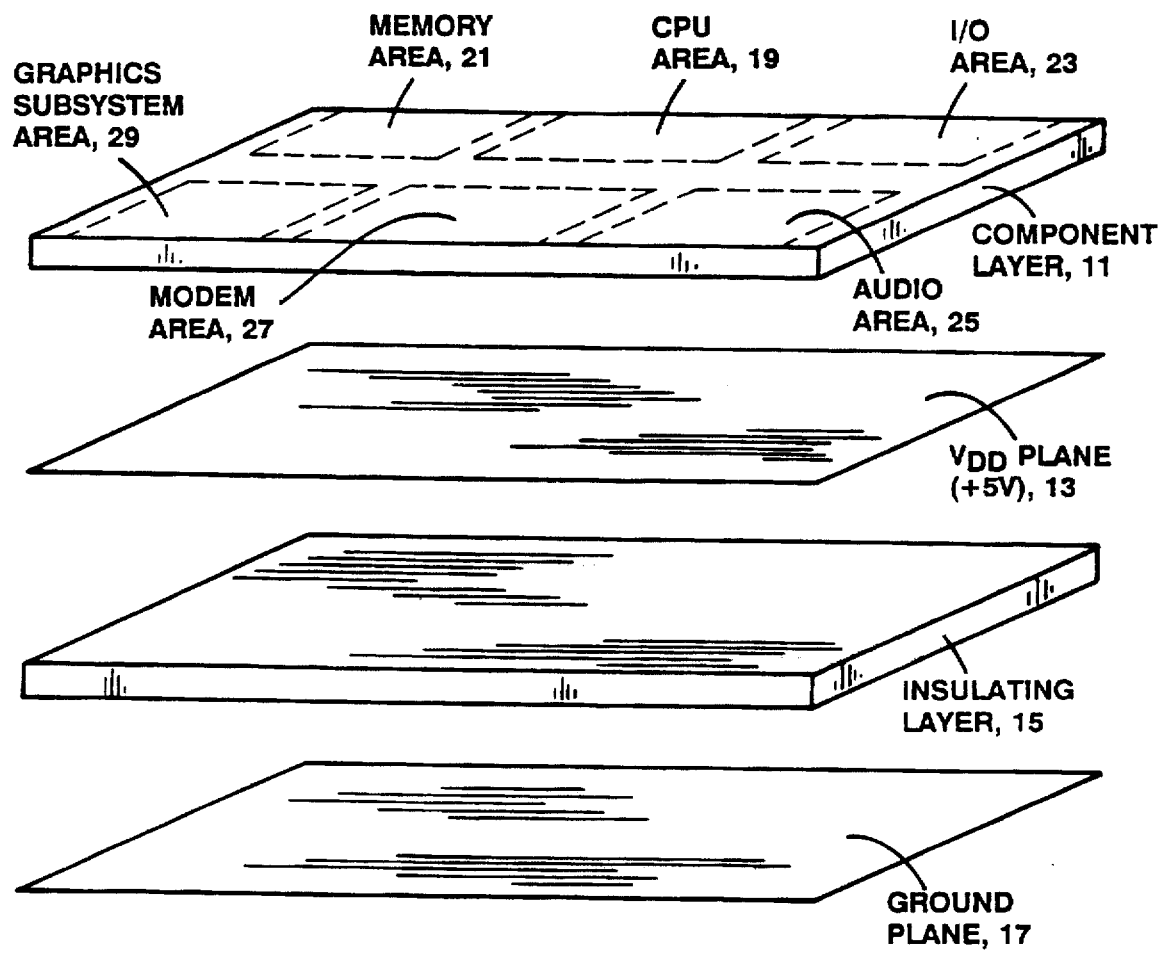
FIG. 1 is an exploded view of a prior art multi-layer circuit board.

In the multi-layer board of FIG. 1, any noise which is coupled onto the $V_{DD}$ plane from one component permeates the entire board and may adversely affect components in other areas of the board. Thus, for the same reason the $V_{DD}$ plane efficiently distributes voltage, it also efficiently distributes noise throughout the board. Noise coupling can cause degradation of audio quality, false triggering of logic, and radiation of high frequency signals.

The current method of reducing noise coupling is to put a large amount of decoupling capacitance around the fast switching devices. This involves placing capacitors to ground along all of the signal paths from each device. While this is effective to a degree, there is a practical limit to the number of decoupling capacitors which can be added due to board space limitations and the large number of signal routings. In addition, with this method, if an EMI (electromagnetic interference) problem occurs, it is virtually impossible to isolate the source of the radiation, thus possibly delaying or even preventing a product from reaching the marketplace.

Figure 2:
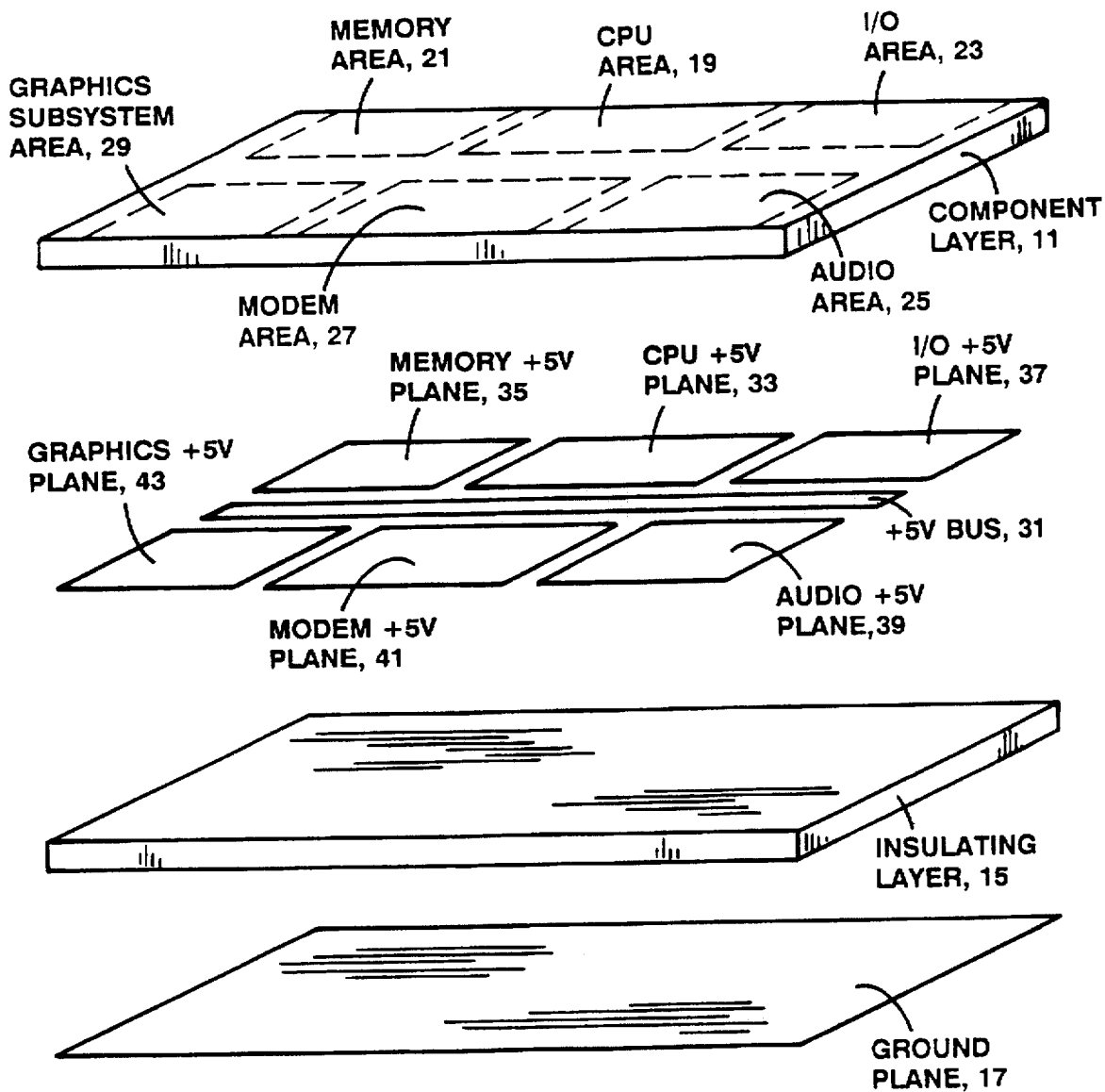
FIG. 2 is an exploded view of a multi-layer circuit board according to an embodiment of the invention.

A power distribution system for a multi-layer circuit board according to an embodiment of the invention is shown in FIG. 2. In this embodiment, the $V_{DD}$ plane 13 of prior art FIG. 1 has been replaced by a single large +5V bus running along the length of the board and an array of discrete +5V planes corresponding to the functional units on the component layer 11. Each of the discrete +5V planes is shaped to match the configuration of the corresponding area on the component layer 11, and is disposed directly beneath that area. Thus, in FIG. 2, CPU +5V plane 33 corresponds to CPU area 19. Similarly, memory +5V plane 35, I/O +5V plane 37, audio +5V plane 39, modem +5V plane 41, and graphics +5V plane 43 are each provided underneath the corresponding area on the component layer 11.

Figure 3:
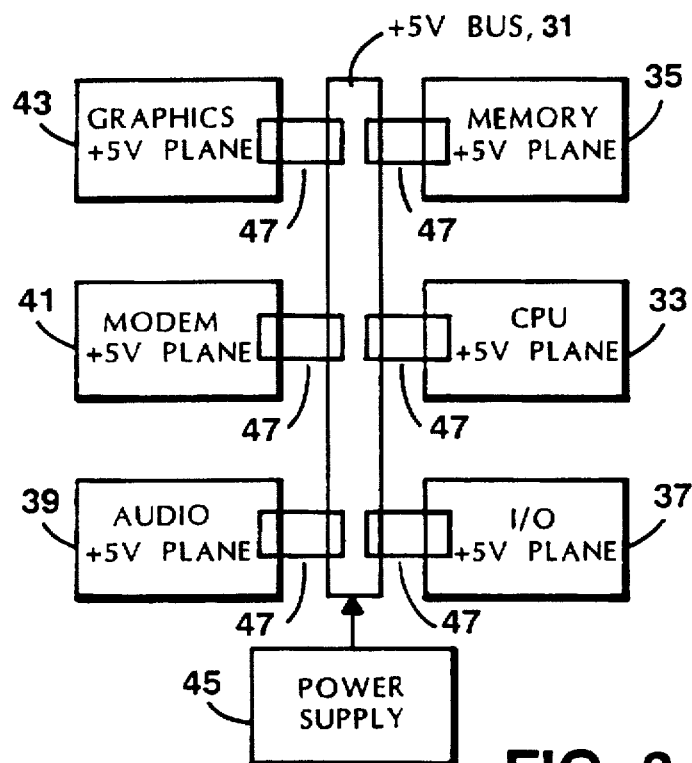
FIG. 3 is a schematic diagram according to the embodiment of FIG. 2.

As shown in the schematic diagram of FIG. 3, +5V bus 31 is powered by an off-board power supply 45 and is connected to each of the discrete +5V planes via a filter 47. Each filter 47 is designed for optimum performance with the specific functional unit with which it is associated. Design of the filters 47 is discussed in more detail below.

The power distribution system of the invention has numerous advantages. One advantage is that any noise which is coupled to the voltage plane by a component of a functional unit is localized within that functional unit, where it may be less destructive. Noise coupling between different functional units, such as from CPU to audio, is virtually eliminated. At the same time, the number of capacitors required, and thus the board space required for power distribution, is greatly reduced.

Another advantage of the invention relates to trouble-shooting the board. If an EMI problem arises during testing of the board shown in FIG. 1, it is virtually impossible to isolate the source of the noise. Once the noise is on the $V_{DD}$ plane, it is everywhere at the same time and is very difficult to trace. In the present invention, any EMI problems which do occur usually can be localized to within a functional unit. Once narrowed down to the functional unit, the problem can be addressed by adding decoupling capacitors or adjusting the filter 47 which supplies that unit. Thus, trouble-shooting of the final design is greatly simplified.

Many different configurations of the power distribution system of the invention are possible. For example, there may be more than one +5V bus 31 (which, of course, could carry any voltage), and it could be formed in any orientation or shape. Similarly, the discrete +5V planes could be formed in any configuration, and need not be coplanar. The order of the layers shown in FIG. 2 could be changed without affecting the invention. Also, the ground plane 17 may be divided into discrete ground planes in a manner similar to the voltage planes.

Figure 4A:
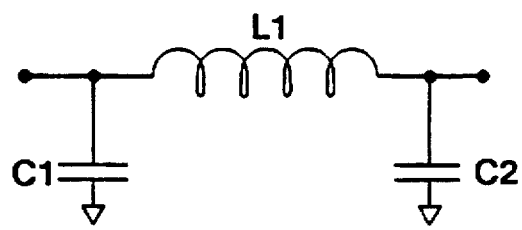
FIGS. 4a, 4b, and 4c are schematic diagrams of three different filter embodiments.

Referring again to FIG. 3, each filter 47 connecting the discrete +5V planes to the +5V bus is designed to meet the requirements of the functional unit it is supplying. For example, FIG. 4a shows a pi-filter having an inductance L1 and capacitors C1, C2. As is well known, the pole of a pi-filter is $$\frac{1}{2\pi\sqrt{LC}}$$

The pole of the filter must be set lower than the operating frequency of the functional unit being supplied. Generally, the lower the frequency the better, but this is limited as a practical matter by the size of the components as the pole frequency is lowered.

As an example, if the CPU in CPU area 19 operates at 50 MHz, the pole of the filter 47 which supplies CPU +5V plane 33 should be set to approximately 10 MHz. On the other hand, for supply to the graphics subsystem area 29, which operates in the 25–80 MHz range, the filter 47 supplying the graphics +5V plane 43 should have a pole in the range of 1–8 MHz.

Figure 4B:
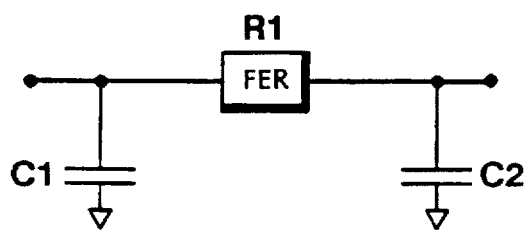

The type of inductance used in the filter is also of importance. For high-frequency applications such as the CPU area 19, the memory area 21, the graphics subsystem area 29, and the I/O area 23, ferrite is preferred (see FIG. 4b). Ferrite actually looks like a resistor at high frequencies, so the pole frequency of the filter of FIG. 4b would be determined by the equation $$\frac{1}{2\pi RC}$$

However, as the operation frequency decreases, the resistance of the ferrite decreases as well, thus requiring a larger and larger capacitance to maintain the same pole frequency. As a result, for low frequency applications such as the audio area 25 and the modem area 27, it is best to use a surface-mount inductor in the filter 47.

Figure 4C:
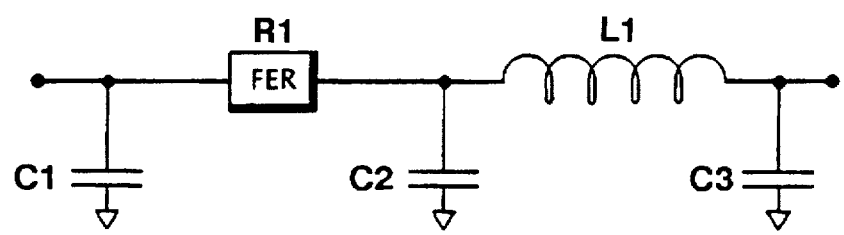

In the case of mixed high and low frequency applications, the filter of FIG. 4c would be applicable. This circuit is a combination of the circuits of FIGS. 4a and 4b, and comprises ferrite R1, inductor L1, and three capacitors C1–C3. The ferrite stage of this circuit would be effective for the high frequency applications, while at lower frequencies the inductor stage would dominate.

Specific embodiments of the invention have been shown and described. However, the invention is not so limited, but instead is limited only by the scope of the appended claims.

What is claimed is:

1. A multi-layer circuit board, comprising:

a component layer;

a ground layer;

an insulation layer; and a power supply system comprising:

a supply bus comprising a contiguous elongated element, discrete voltage supply planes disposed exterior to said contiguous elongated element, said discrete voltage supply planes and said supply bus lying in a plane between said insulation layer and said component layer, and isolation devices mounted on said component layer each connecting one of said discrete voltage supply planes to said supply bus along the contiguous elongated element;

wherein said component layer has a first area for components that perform a first function and a second area for components that perform a second function;

wherein said discrete voltage supply planes comprise a first supply plane corresponding to and disposed directly beneath said first area and a second supply plane corresponding to and disposed directly beneath said second area;

wherein said power supply bus provides power to said discrete voltage supply planes via said isolation devices; and wherein power to the components in the first area is provided by the first supply plane and power to components in the second area is provided by the second supply plane.

2. The multi-layer board of claim 1, wherein said first function comprises a high-frequency operation, and wherein the isolation device corresponding to said first supply plane comprises a filter having a ferrite element.

3. The multi-layer board of claim 2, wherein said first function comprises a central processing function.

4. The multi-layer board of claim 2, wherein said first function comprises a memory function.

5. The multi-layer board of claim 2, wherein said first function comprises an graphics function.

6. The multi-layer board of claim 1, wherein said second function comprises a low-frequency operation, and wherein the isolation device corresponding to said second supply plane comprises a filter having an inductor.

7. The multi-layer board of claim 6, wherein said second function comprises an audio function.

8. The multi-layer board of claim 6, wherein said second function comprises a modem function.

9. The multi-layer board of claim 1, wherein said first function comprises a high-frequency operation and said second function comprises a low-frequency operation, and wherein the isolation device corresponding to said first supply plane comprises a filter having a ferrite element and the isolation device corresponding to said second supply plane comprises a filter having an inductor.

10. The multi-layer board of claim 9, wherein said first function comprises a graphics function and said second function comprises an audio function.

11. The multi-layer board of claim 1, wherein said first function comprises a mixed low and high-frequency operation, and wherein the isolation device corresponding to said first supply plane comprises a filter having an inductor and a ferrite element connected in series.

12. The multi-layer board of claim 1, wherein said supply bus comprises a longitudinal element.

13. The multi-layer board of claim 1, wherein said supply bus extends from one edge of the board to an opposite edge of the board.

14. The multi-layer board of claim 1, wherein said supply bus extends through a central region of said power supply system and between said first power supply plane and said second power supply plane.

15. The multi-layer board of claim 1, wherein said supply bus divides said power supply system into first and second regions, said first power supply plane lying in said first region and said second power supply plane lying in said second region.

16. A multi-layer circuit board, comprising:

a component layer having a first area for components that perform a first function and a second area for components that perform a second function;

a ground layer;

an insulation layer; and a power supply system comprising:

a supply bus comprising a contiguous elongated element extending through a central region of said power supply system, discrete voltage supply planes disposed exterior to said contiguous elongated element, said discrete voltage supply planes and said supply bus lying in a plane between said insulation layer and said component layer, and isolation devices mounted on said component layer each connecting one of said discrete voltage supply planes to said supply bus along the contiguous elongated element;

wherein said discrete voltage supply planes comprise a first supply plane corresponding to and disposed directly beneath said first area and a second supply plane corresponding to and disposed directly beneath said second area, said first and second supply planes being disposed on opposite sides of said contiguous elongated element;

wherein said first function comprises a high-frequency operation, and wherein the isolation device corresponding to said first supply plane comprises a filter having a ferrite element;

wherein said second function comprises a low-frequency operation, and wherein the isolation device corresponding to said second supply plane comprises a filter having an inductor;

wherein said power supply bus provides power to said isolation devices; and wherein power to the components in the first area is provided by the first supply plane and power to the components in the second area is provided by the second supply plane.

* * * * *